United States Patent [19]

Kato

[11] Patent Number: 5,083,284
[45] Date of Patent: Jan. 21, 1992

[54] APPARATUS FOR PREDICTING THE LIFETIME OF CABLE FOR MOVABLE PORTION OF INDUSTRIAL ROBOT

[75] Inventor: Hisao Kato, Inazawa, Japan

[73] Assignee: Mitsubishi Denki K.K., Tokyo, Japan

[21] Appl. No.: 467,428

[22] Filed: Jan. 19, 1990

[30] Foreign Application Priority Data

Jan. 24, 1989 [JP] Japan .................................. 1-14813

[51] Int. Cl.$^5$ ........................ G06F 15/46; G06F 15/20
[52] U.S. Cl. .................................... 364/508; 364/550; 901/49; 901/50; 377/16
[58] Field of Search .................. 901/2, 14, 19, 49, 50; 364/481, 506, 508, 550, 152; 73/767, 787; 377/15, 16; 324/627

[56] References Cited

U.S. PATENT DOCUMENTS

| | | | |
|---|---|---|---|
| 3,777,555 | 12/1973 | Petrisko et al. | 73/787 |
| 4,206,346 | 6/1980 | Hirosawa et al. | 377/15 |
| 4,500,969 | 2/1985 | Hasselmann et al. | 364/508 |
| 4,647,844 | 2/1987 | Biegon et al. | 324/627 |
| 4,659,279 | 4/1987 | Akeel et al. | 901/50 |
| 4,733,361 | 3/1988 | Kriesser et al. | 364/506 |
| 4,780,045 | 10/1988 | Akeel et al. | 901/50 |
| 4,795,957 | 1/1989 | MacNeal, Jr. et al. | 901/49 |
| 4,949,263 | 8/1990 | Jurca | 377/16 |
| 4,969,795 | 11/1990 | Toyoda et al. | 901/50 |

FOREIGN PATENT DOCUMENTS

| | | |
|---|---|---|
| 0150622 | 8/1985 | European Pat. Off. . |
| 0266519 | 5/1988 | European Pat. Off. . |
| 07159 | 12/1986 | PCT Int'l Appl. . |
| 1515570 | 6/1978 | United Kingdom . |
| 2107885 | 5/1983 | United Kingdom . |
| 2189613 | 10/1987 | United Kingdom . |

*Primary Examiner*—Kevin J. Teska
*Attorney, Agent, or Firm*—Sughrue, Mion, Zinn, Macpeak & Seas

[57] ABSTRACT

An apparatus for predicting the lifetime of cables for movable portions of an industrial robot, the apparatus comprising: measuring devices connected to the cables for the movable portions of the industrial robot for measuring mechanical movement of the cables for said movable portions; and a CPU for making accummulating results obtained by the measuring devices and predetermined reference values to determine that the cables for said movable portions have exceeded their lifetime if the accumulated exceeds a predetermined reference value.

3 Claims, 11 Drawing Sheets

F I G. 1
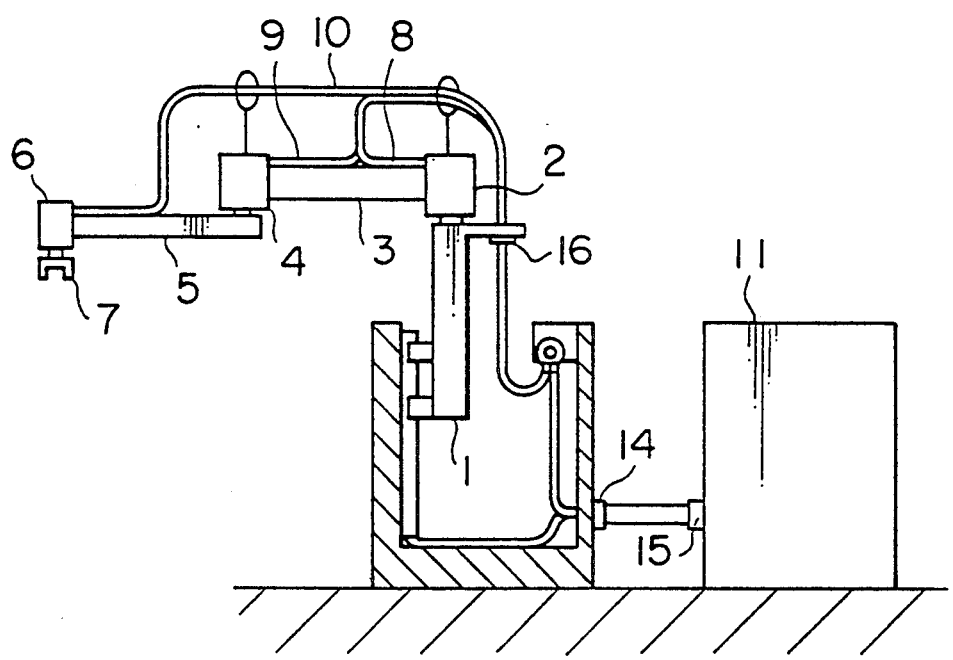

8,9,10
24a,24b,24c

APPARATUS FOR PREDICTING THE LIFETIME OF CABLE FOR MOVABLE PORTION OF INDUSTRIAL ROBOT

BACKGROUND OF THE INVENTION

1. Field of the Invention

The present invention relates to an apparatus for predicting the lifetime of cables arranged in movable portions such as arm portions of an industrial robot.

2. Description of the Related art

Cables for movable portions are arranged in the arm portions of an industrial robot so that the arm portions can be moved. Since each of the cables for the movable portions of the type described above is given bending stress and torsional stress when the arm portions move, the cables for the movable portions suffer from a problem in terms of their short lifetime.

If an industrial robot in which a strand constituting the cable has been broken due to the expiration of the lifetime were continued to be used, the operation of the industrial robot is stopped, causing the production line using the same to be also stopped. Alternatively, an error taking place during the operation of the robot can damages the outer equipment, causing an accident resulting in injury or death in the worst case.

Hitherto, a variety of apparatuses capable of detection of the breaking of the cable have been disclosed. For example, there has been an apparatus disclosed in Japanese Patent Laid-Open No. 62-165158, the apparatus being capable of detecting the breaking of an output cable of a rotary encoder which is provided for the purpose of detecting the angle or the position of the arm or the like of an industrial robot. Another apparatus capable of detecting the breaking of the cable arranged in a resistance welding machine has been disclosed in Japanese Patent Laid-Open No. 62-245162.

However, since the above-disclosed conventional apparatuses for detecting the breaking of a cable are arranged simply to detect the breaking of the cable, they cannot predict the breaking of the cable depending upon the result of the detection of the lifetime of a cable, that is, the state of the fatigue of the cable.

SUMMARY OF THE INVENTION

In order to overcome the above-described conventional problems, an object of the present invention is to provide an apparatus for predicting the lifetime of cables in the movable portions of an industrial robot, the apparatus being capable of predicting the lifetime of the cables for the movable portions prior to the breaking of the same.

According to the present invention, there is provided an apparatus for predicting the lifetime of cables for movable portions of an industrial robot, the apparatus comprising: measuring means connected to the cables for the movable portions of the industrial robot for measuring electric characteristics of the cables for the movable portions; and determining means for making comparisons between results of measurements obtained by the measuring means and predetermined reference values to determine that the cables for the movable portions have expired their lifetime if the results of the measurements exceed the predetermined reference values.

Another aspect of the present invention lies in an apparatus for predicting the lifetime of cables for movable portions of an industrial robot, the apparatus comprising: conductive members formed in the lengthwise direction of the surface of the cables for the movable portions of the industrial robot; measuring means connected to the conductive members for measuring electric characteristics of the cables for the movable portions; and determining means for making comparisons between results of measurements obtained by the measuring means and predetermined reference values to determine that the cables for the movable portions have expired their lifetime if the results of the measurements exceed the predetermined reference values.

A still further aspect of the present invention lies in an apparatus for predicting the lifetime of cables for movable portions of an industrial robot, the apparatus comprising: storage means for storing predetermined degrees of the amount of bending and torsion of the cables for the movable portions, the predetermined degrees of amount of bending and torsion being determined for each of regions formed by dividing an operating region of an arm in which the cables for the movable portions are arranged into a plurality of sections; arithmetic means for reading out the degree which corresponds to the position of the arm from the storage means whenever the arm stops and adding the degrees; and determining means for making comparisons between results of additions obtained by the arithmetic means and predetermined reference values to determine that the cables for the movable portions have exceeded their lifetime if the results of the addition exceed the predetermined reference values.

BRIEF DESCRIPTION OF THE DRAWINGS

FIG. 1 is a side-elevational view which illustrates an industrial robot equipped with a lifetime predicting apparatus according to a first embodiment of the present invention:

DESCRIPTION OF THE PREFERRED EMBODIMENTS

Figure 2:
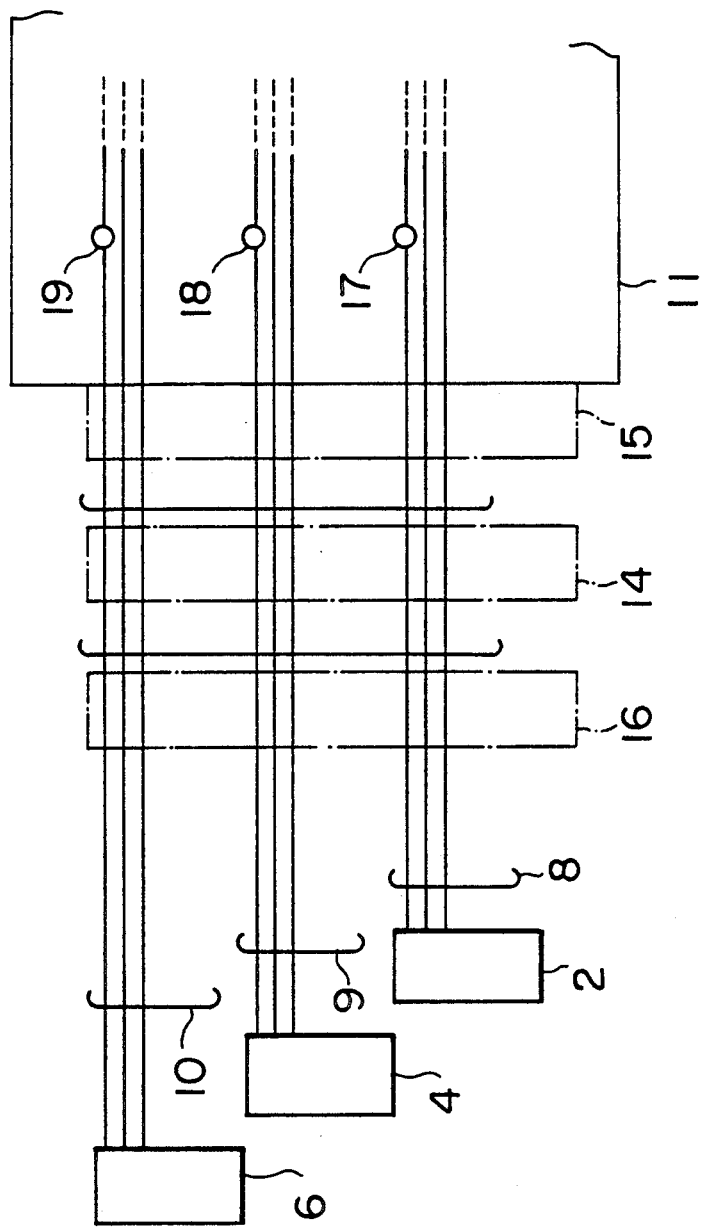
FIG. 2 is a schematic view which illustrates an essential portion of the first embodiment.

Embodiments of the present invention will now be described with reference to the accompanying drawings.

First, a lifetime predicting apparatus according to a first embodiment will be described with reference to FIGS. 1 to 4. An industrial robot comprises, as shown in FIG. 1, an elevation shaft 1. A first articulation operation mechanism 2 is secured to the upper end portion of the elevation shaft 1. A second articulation operation mechanism 4 is connected to the first articulation operation mechanism 2 via a first arm 3. A third articulation operation mechanism 6 is connected to the second articulation operation mechanism 4 via a second arm 5. A hand 7 is connected to the third articulation operation mechanism 6. The first, the second, and the third articulation operation mechanisms 2, 4 and 6 are connected to a controller 11 via cables 8, 9 and 10, respectively, which are arranged in movable portions. The cables 8, 9 and 10 are collectively bound and divided into three sections in terms of the length thereof so as to be connected by connectors 16, 14 and 15 before being connected to the controller 11.

Figure 3:
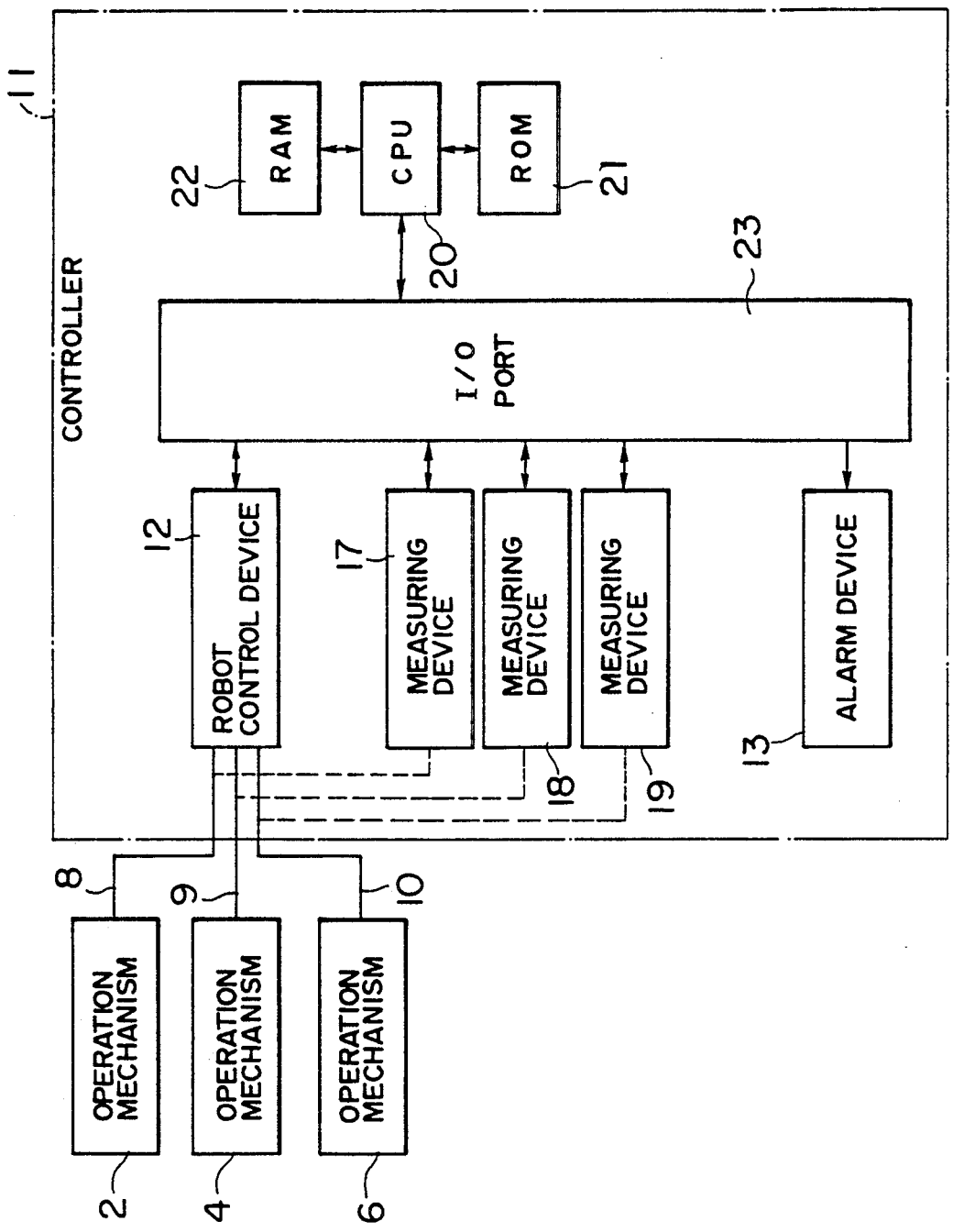
FIG. 3 is a block diagram which illustrates the first embodiment.

As shown in FIG. 2, in the controller 11, the cables 8, 9 and 10 are provided with corresponding measuring devices 17, 18 and 19 for the purpose of measuring each of the resistance of the cables 8, 9 and 10. The measuring devices 17, 18 and 19 are connected to a CPU 20 via an I/O port 23 as shown in FIG. 3. The cables 8, 9 and 10 are connected to a robot control device 12 which is capable of controlling the action of the robot, this robot control device 12 being connected to the CPU 20 via the I/O port 23. A ROM 21 and a RAM 22 are connected to the CPU 20, and an alarm device 13 is also connected to the CPU 20 via the I/O port 23. A program capable of operating the CPU 20 is previously stored in the ROM 21, while a reference level of the resistance for each of the cables 8, 9 and 10 is previously stored in the RAM 22.

Then, the operation of the first embodiment will be described with reference to a flow chart shown in FIG. 4. First, the robot control device 12 is operated in response to a command issued from the CPU 20. As a result, the operation mechanisms 2, 4 and 6 cause the first arm 3, the second arm 5 and the hand 7 to be operated so that the industrial robot is operated (step S1). The CPU 20 determines whether or not the operation for one cycle has been completed in response to a signal supplied from the robot control device 12 (step S2). If it is determined that one cycle of the operation has been completed, the CPU 20 supplies commands to the measuring devices 17, 18 and 19 to measure the resistance of each of the cables 8, 9 and 10 so that the measurement of the resistance is conducted (step S3).

The CPU 20 receives the thus measured results obtained from the measuring devices 17, 18 and 19, and then makes comparisons between the received results and the reference values which have been stored in the RAM 22 (step S4). If all of the results of the measurements are below the reference levels respectively, it is determined that each of the cables 8, 9 and 10 is normal, and the flow returns to step S1. On the other hand, if at least any of the results of the measurements exceeds the corresponding reference level in step S4, the CPU 20 determines that the cable is close to exceeding its lifetime, issues a command to the robot control device 12 to stop the operation of the robot, and causes the alarm device 13 to generate an alarm (step S5).

Although the normal resistance of each of the cables 8, 9 and 10 for movable portions is smaller than, for example, 1 Ω, it becomes several to several tens Ω in a semi-disconnection state in which a portion of the strands constituting the cable is broken. The resistance becomes infinite in a complete-disconnection state in which all of the strands are broken. Therefore, the reference level may be determined to be 1 Ω for the purpose of predicting the fact that the cable almost expires its lifetime if the results of the measurements of the resistances obtained by the measuring devices 17, 18 and 19 exceed 1 Ω.

Therefore, according to this embodiment, the lifetime of the cables 8, 9 and 10 for movable portions can be predicted prior to the complete breaking of these cables. As a result, the safety and the reliability of the industrial robot can be improved and any trouble deteriorating the production schedule can be prevented.

Although the resistances are measured by the measuring devices 17, 18 and 19 according to the above-described embodiment, the structure may be constituted in such a manner that each of electric currents passing through the cables 8, 9 and 10 is measured. In this case, the structure may be arranged in such a manner that the current level when the resistance becomes 1 Ω is arranged to be the reference level so that prediction that the lifetime of cable is almost expired can be made when the result of the measurement is smaller than the thus arranged reference level.

As an alternative to the alarm device 13, another alarm device utilizing light can be employed.

Figure 5:
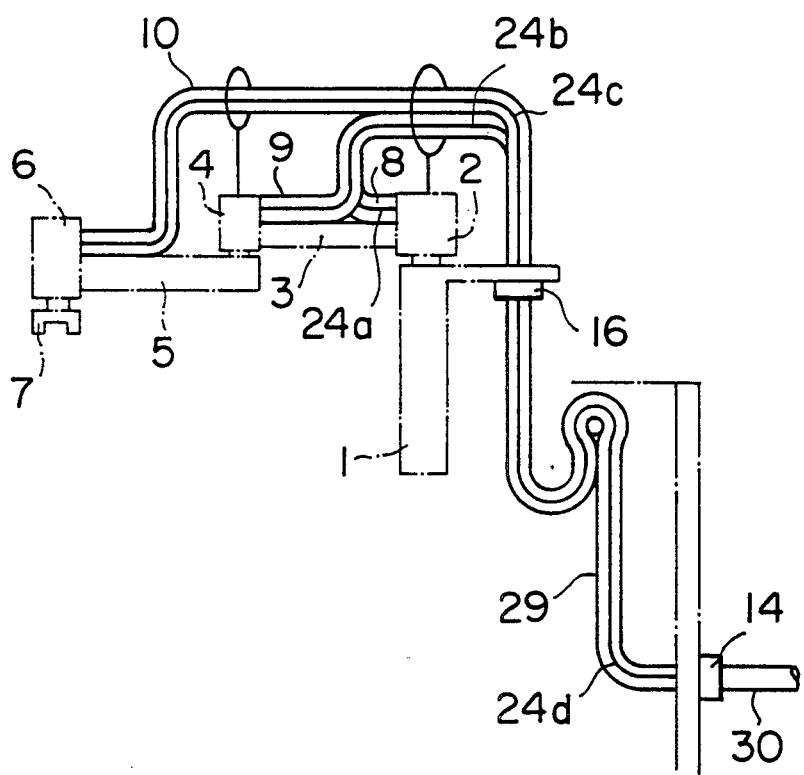
FIG. 5 is a view which illustrates a portion of an industrial robot equipped with the lifetime predicting apparatus according to a second embodiment.
Figure 6:
FIG. 6 is a cross-sectional view which illustrates the cable shown in FIG. 5.

Then, the lifetime predicting apparatus according to a second embodiment will be described with reference to FIGS. 5 to 8. According to the second embodiment, conductive members 24a to 24c are adhered to the surface of the corresponding cables 8 to 10 in the lengthwise directions. Referring to FIGS. 5 and 6, the conductive members 24a to 24c are connected to connection cables by the connector 16 before being collectively bound into a cable 29 together with the cables 8, 9 and 10. Another conductive member 24d is adhered to the surface of the cable 29 which establishes the connection between the connector 16 and the connector 14, the conductive member 24d being connected to a connection cable at the connector 14 before being bound into a cable 30 together with the cables 8 to 10 and each of the connection cables connected to the conductive members 24a to 24c.

Figure 7:
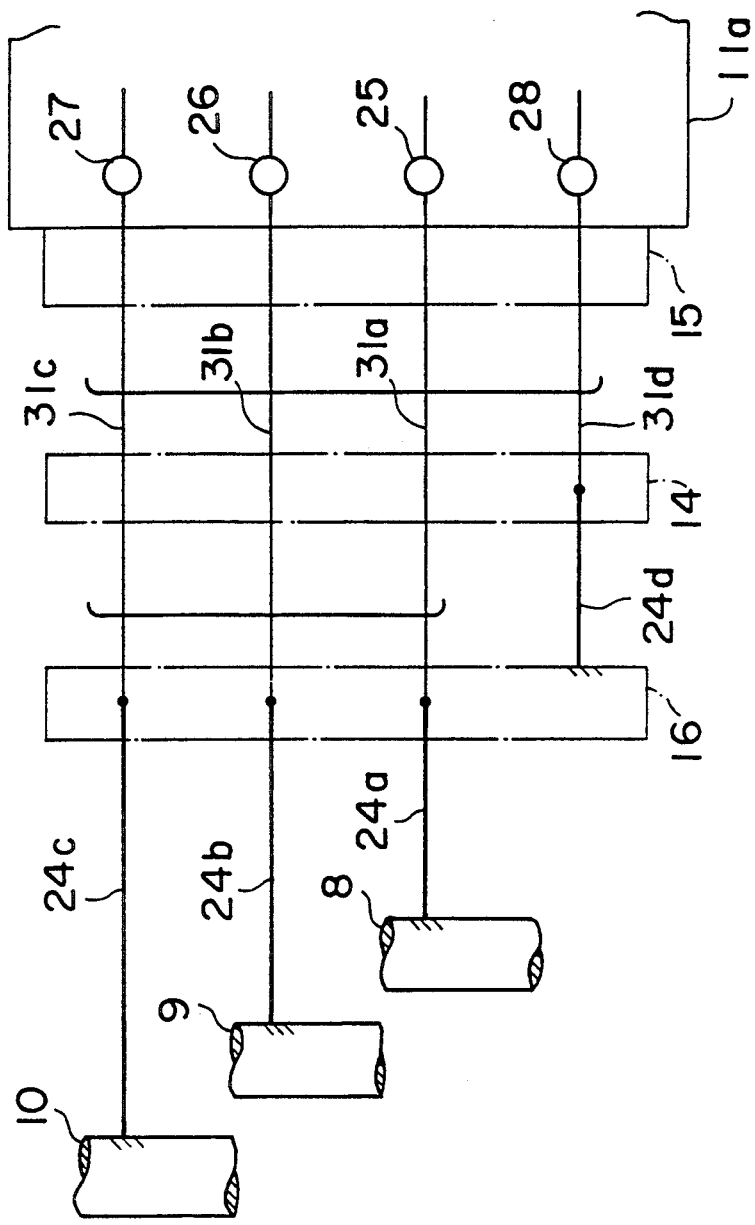
FIG. 7 is a schematic view which illustrates an essential portion of the second embodiment.
Figure 8:
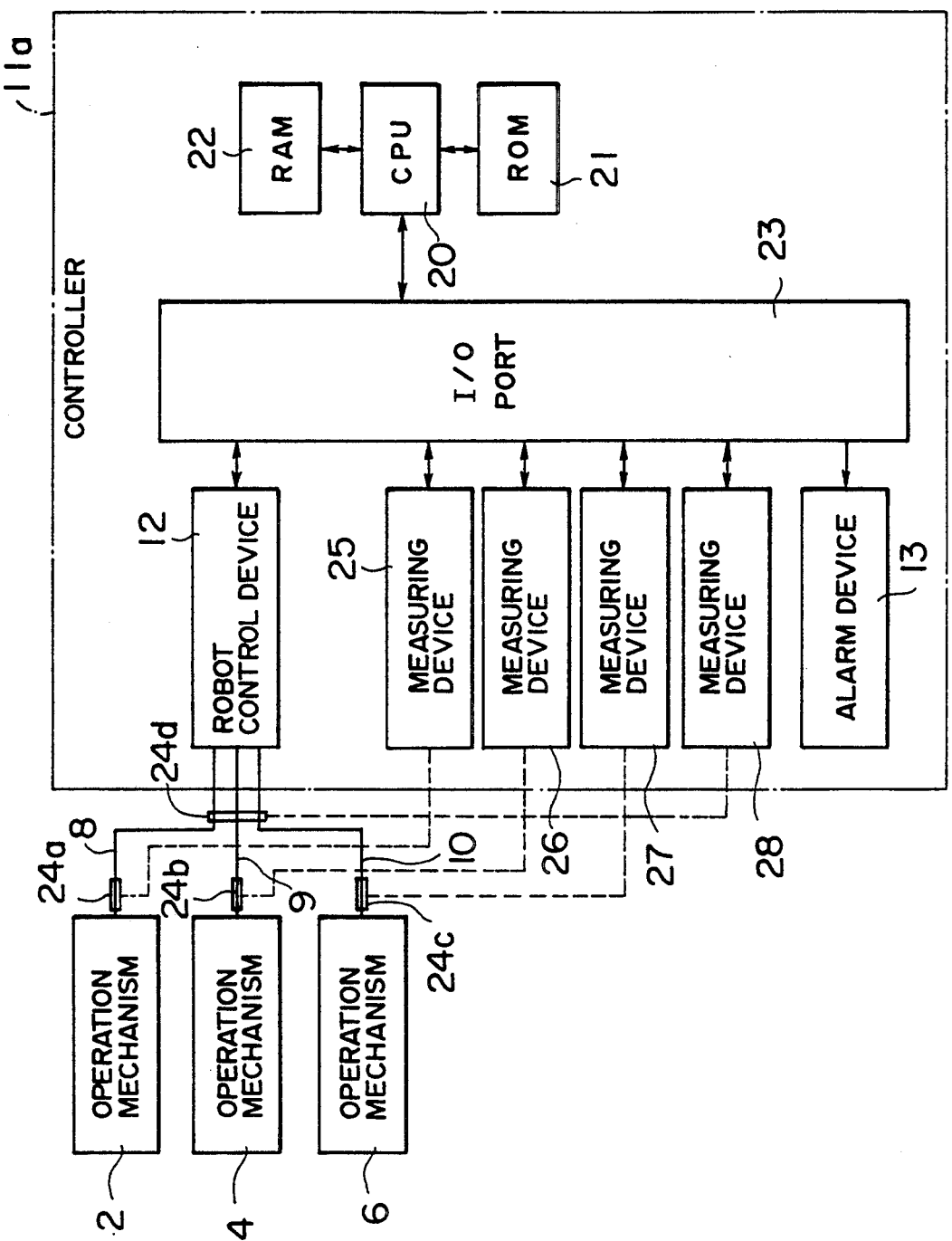
FIG. 8 is a block diagram which illustrates the second embodiment.

As shown in FIG. 7, connection cables 31a to 31d connected to the conductive members 24a to 24d are respectively connected to the measuring devices 25 to 28 which are capable of measuring the resistance of each of the conductive members 24a to 24d. The measuring devices 25 to 28 are connected to the CPU 20 via the I/O port 23 as shown in FIG. 8. The RAM 22 has previously stored the reference level of the resistance of each of the conductive members 24a to 24d.

Figure 4:
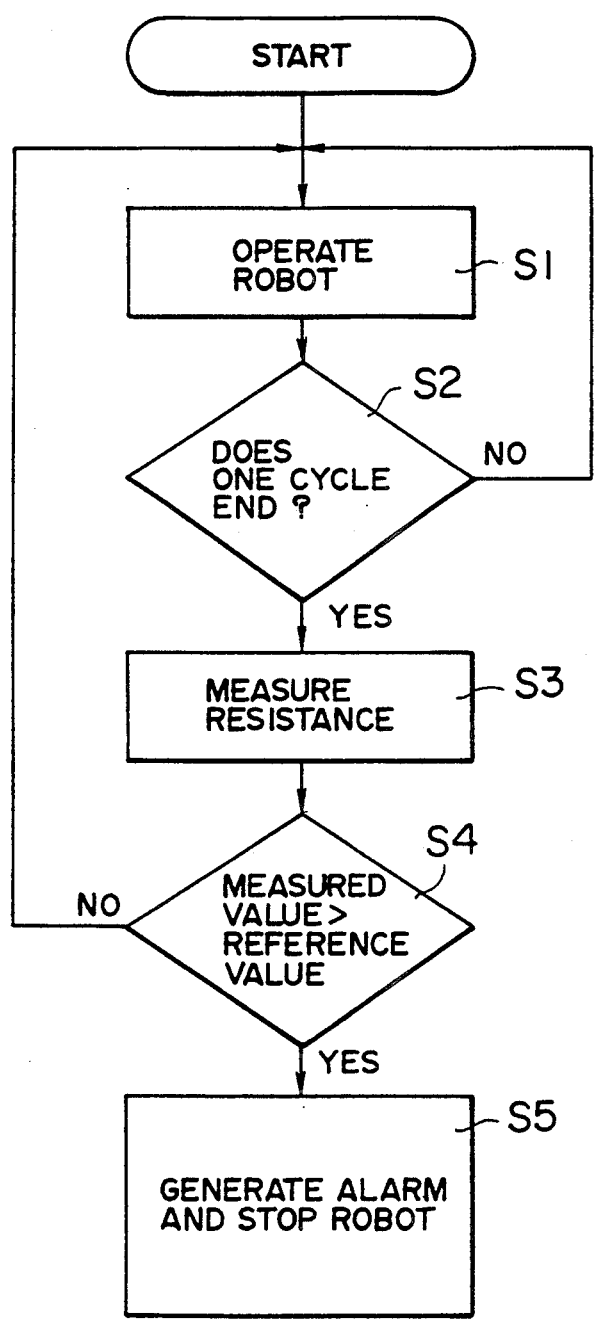
FIG. 4 is a flow chart which illustrates the operation of the first embodiment.

The operation of the apparatus according to the second embodiment is, similarly to the apparatus according to the first embodiment shown in FIG. 4, conducted in such a manner that whenever the robot completes one cycle of its operation, the resistances of the conductive members 24a to 24d are measured by the measuring devices 25 to 28 so as to be subjected to comparisons with the corresponding reference levels. That is, as an alternative to the direct measuring of the electric characteristic of each of the cables 8 to 10, the states of fatigue of the cables 8, 9 and 10 arranged between each of the operation mechanisms 2, 4 and 6 and the connector 16 are determined depending upon the resistance level of each of the conductive members 24a to 24c adhered to the corresponding cables 8 to 10. Furthermore, the states of fatigue of the same arranged between the connectors 16 and 14 are determined depending upon the resistance level of the conductive member 24d adhered to the cable 29. Since the conductive members 24a to 24d adhered to the surfaces of the cables 8 to 10 and 29 are given the similar levels of the bending stress and torsional stress which are given to each of the cables 8 to 10 and 29, the lifetime of each of the cables 8 to 10 can be predicted by measuring the resistance of each of the conductive members 24a to 24d.

The conductive members 24a to 24d are formed by applying conductive tapes or printing conductive materials. As the conductive tape, a metal foil made of, for example, copper, or aluminum can be used. A required resistance level can be achieved by properly determining the thickness, the width, and the like of the tape. On the other hand, the printing of the conductive material can be conducted by applying a binder which contains metal powder such as copper, aluminum, or the like to the surface of the cable.

Although the resistance of each of the conductive members 24a to 24d is measured according to the second embodiment, the current level may be measured.

Figure 9:
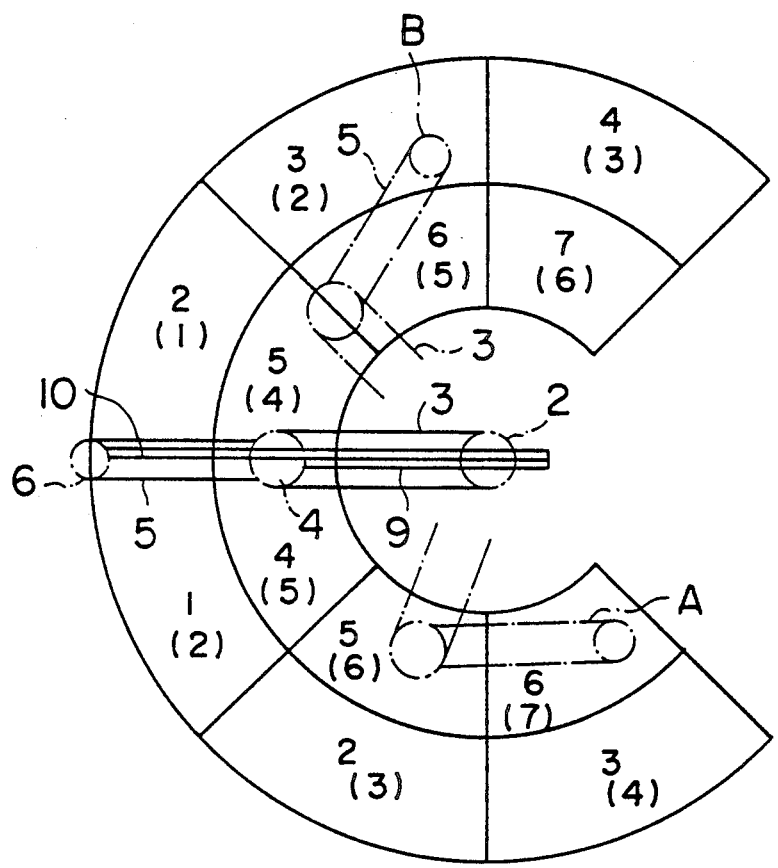
FIGS. 9 and 10 are views each of which illustrates an operating region of the arm and the elevation shaft of the industrial robot in a third embodiment.

Then, the life predicting apparatus according to a third embodiment will be described with reference to FIGS. 9 to 11. According to the third embodiment, the working region of the first arm 3 and that of the second arm 5 are divided into a plurality of sections and a value corresponding to the amount of the bending and the torsion of the cables 8, 9 and 10 for movable portions is respectively determined previously for each of the sections. Referring to FIG. 9, the values corresponding to the operation conducted by the right hand system as designated by an alternate long and short dash line A are indicated by numbers in parentheses, while the values corresponding to the operation conducted by the left hand system as designated by an alternate long and short dash line B are indicated by numbers without the parentheses. The greater the number is, the greater the amount of the bending and torsion is.

Figure 10:
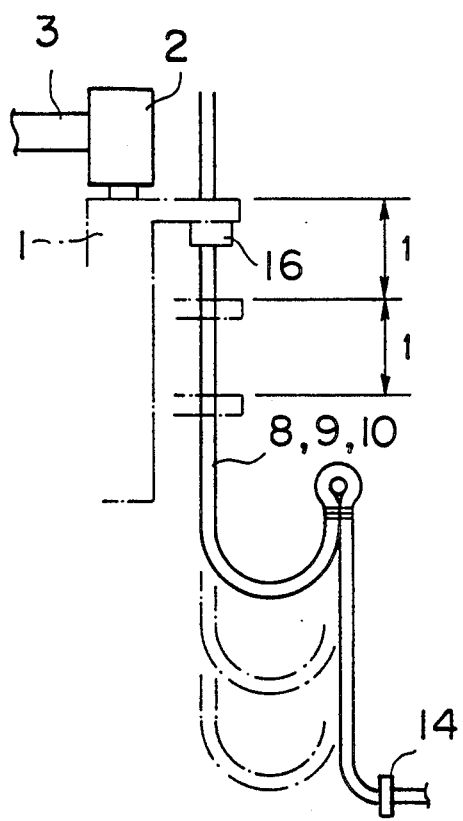

As shown in FIG. 10 for the cables 8, 9 and 10 arranged between the connectors 16 and 14, the number to be accumulated is determined to be 1 when the elevation shaft 1 moves in any of the vertical directions with respect to the intermediate position of the movement of the elevation shaft 1 serving as the reference position.

Figure 11:
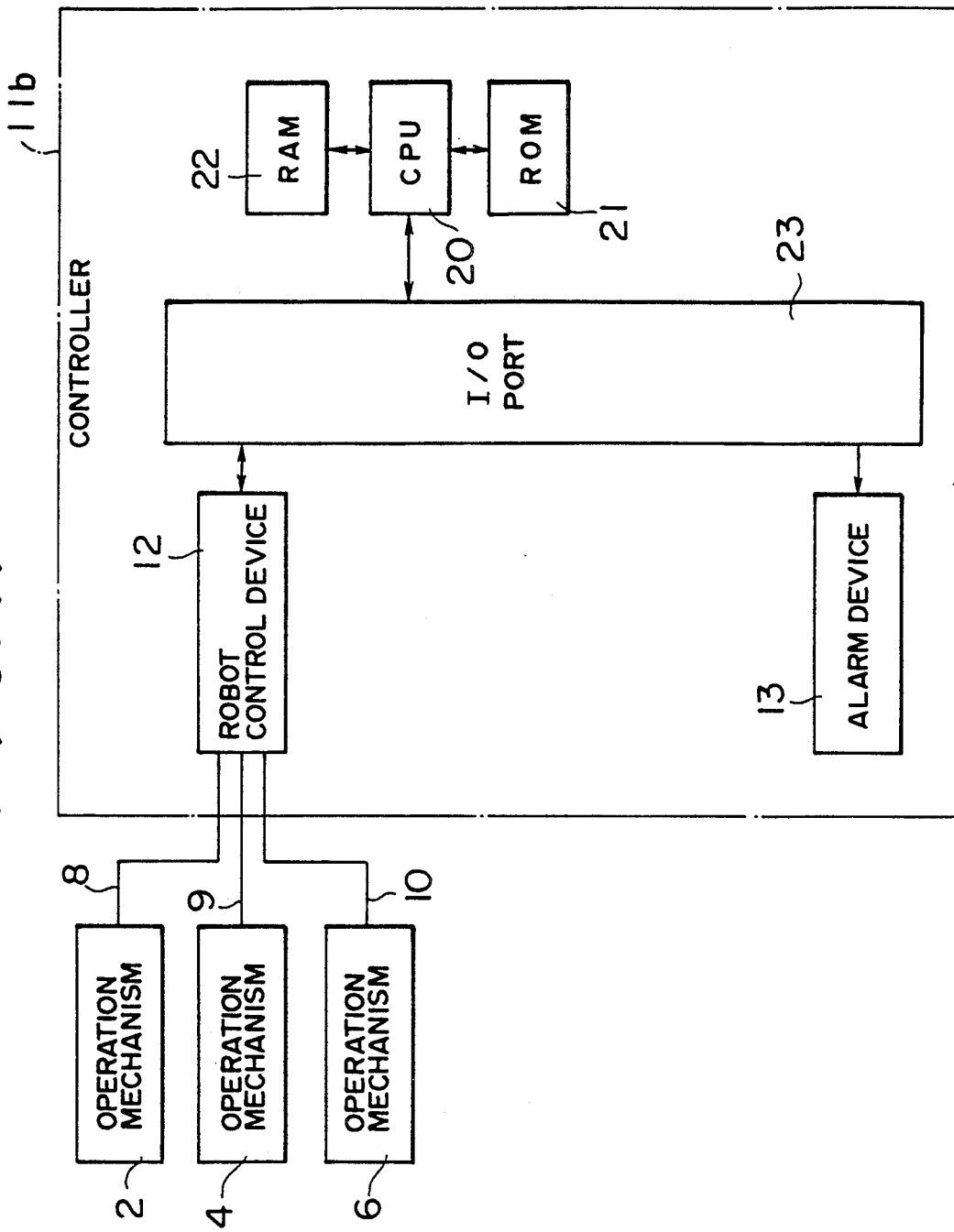
FIG. 11 is a block diagram which illustrates the third embodiment.

Referring to FIG. 11, the RAM 22 in the controller 11b has previously stored the values corresponding to the regions shown in FIGS. 9 and 10. The CPU 20 causes the robot control device 12 to operate. As a result, the industrial robot is operated. In synchronization with the operation of the robot, the CPU 20 receives positional information about the third operation mechanism 6 via the robot control device 12. Whenever the third operation mechanism 6 stops, the CPU 20 reads the value corresponding to the region in which the third operation mechanism 6 is positioned from the RAM 22 and accumulates this value. Similarly, whenever the elevation shaft 1 stops, the CPU 20 receives positional information about the elevation shaft 1 via the robot control device 12, and the CPU 20 reads the value corresponding to the position of the same from the RAM 22 and accumulates this value also. If the accumulated results exceed a predetermined level, the lifetime of the cables 8 to 10 arranged between the operation mechanisms 2, 4 and 6 and the connector 16, and the lifetime of the cables 8 to 10 arranged between the connectors 16 and 14 have been exceeded. As a result, the CPU 20 stops the operation of the robot, and causes the alarm device 13 to generate an alarm.

Figure 12:
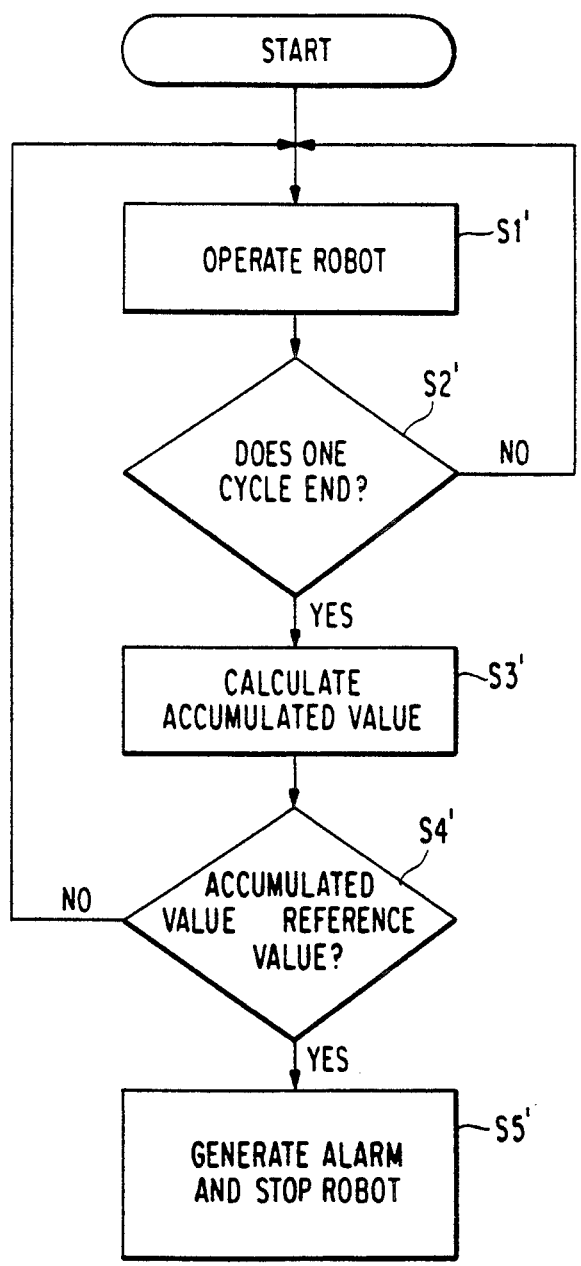
FIG. 12 is a flowchart of the operation of the third embodiment.

The operation of the third embodiment will be described with reference to a flow chart shown in FIG. 12. First, the robot control device 12 is operated in response to a command issued from the CPU 20. As a result, the operation mechanism 2, 4 and 6 cause the first arm 3, the second arm 5 and the hand 7 to be operated so that the industrial robot is operated (step S1'). The CPU 20 determines whether or not the operation for one cycle has been completed in response to a signal supplied from the robot control device 12 (step S2'). If it is determined that one cycle of the operation has been completed, the CPU 20 reads a previously stored accumulated value and value corresponding to the position of first arm 3, second arm 5 and hand 7 (step S3').

The CPU 20 adds the previously stored accumulated value to the present value and then makes comparisons between the new accumulated value and a predetermined reference value, which is also stored in the RAM 22 (strep S4'). If the new accumulated value is less than the reference value, it is determined that each of the cables 8, 9 and 10 is normal, then new accumulated value is stored in RAM 22 and the flow returns to step S1'. On the other hand, if the new accumulated value results of the measurments exceeds the corresponding reference value in step S4', the CPU 20 determines that the cable is close to exceeding its lifetime, issues a command to the robot control device 12 to stop the operation of the robot, and causes the alarm device 13 to generate an alarm (step S5').

Also according to the third embodiments, the lifetime of the cables 8 to 10 can be predicted similarly to the first and second embodiments prior to the complete breaking of the same for movable portions.

The degrees described in FIGS. 9 and 10 serve as only one example. Therefore, the degrees corresponding to the industrial robot to be used may be previously determined.

What is claimed is:

1. An industrial robot having means for determining the lifetime of cables for movable portions of said industrial robot, comprising:

means for positioning and stopping an arm of said industrial robot;

means for detecting that said arm is in a stopped position;

storage means for storing a plurality of predetermined values corresponding to an amount of bending and torsion of said cables for said movable portions, said predetermined values being determined for each of a plurality of regions defined by dividing an operation region of said arm in which said cables for said movable portions are arranged into a plurality of sections;

means for reading out one of said predetermined values which corresponds to the position of said arm from said storage means whenever said arm is stopped;

means for reading an accumulated value from said storage means;

means for calculating a new accumulated value based on said value and said accumulated value and for replacing said accumulated value in said storage means with said new accumulated value;

comparing means for making comparisons between said new accumulated value and a predetermined reference value so as to determine that said cables for said movable portions have exceeded their lifetime when said new accumulated value exceeds said predetermined reference value; and means for controlling said industrial robot based on said new accumulated value.

2. An apparatus according to claim 1, wherein said means for controlling further comprises an alarm device for issuing an alarm.

3. An apparatus according to claim 1, wherein said means for controlling comprises means for stopping the operation of said industrial robot.

* * * * *